(12) United States Patent
Okamura

(10) Patent No.: US 6,510,549 B1
(45) Date of Patent: Jan. 21, 2003

(54) METHOD OF DESIGNING A SEMICONDUCTOR INTEGRATED CIRCUIT DEVICE IN A SHORT TIME

(75) Inventor: Hitoshi Okamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/503,933

(22) Filed: Feb. 14, 2000

(30) Foreign Application Priority Data

Feb. 17, 1999 (JP) ............................................. 11-039231

(51) Int. Cl.$^7$ ........................ G06F 17/50; G06F 9/455; G06F 9/45; H03K 19/00
(52) U.S. Cl. ............................... 716/17; 716/8; 716/11
(58) Field of Search ................................. 716/17, 8, 11

(56) References Cited

U.S. PATENT DOCUMENTS

| | | | | |
|---|---|---|---|---|
| 5,068,823 A | * | 11/1991 | Robinson | 716/16 |
| 5,260,608 A | * | 11/1993 | Marbot | 327/261 |
| 5,268,937 A | * | 12/1993 | Marbot | 375/377 |
| 5,625,563 A | * | 4/1997 | Rostoker et al. | 716/2 |
| 5,761,483 A | * | 6/1998 | Trimberger | 716/2 |
| 5,784,291 A | * | 7/1998 | Chen et al. | 716/10 |
| 5,883,814 A | * | 3/1999 | Luk et al. | 716/2 |
| 5,987,238 A | * | 11/1999 | Chen | 716/1 |
| 6,173,432 B1 | * | 1/2001 | Harrison | 716/1 |
| 6,202,197 B1 | * | 3/2001 | Robinson et al. | 716/17 |
| 6,216,254 B1 | * | 4/2001 | Pesce et al. | 716/5 |

FOREIGN PATENT DOCUMENTS

| | | | |
|---|---|---|---|
| JP | 60-1845 | 1/1985 | H01L/21/82 |
| JP | 62-217632 | 9/1987 | H01L/21/82 |
| JP | 63-69262 | 3/1988 | H01L/27/04 |
| JP | 1-132135 | 5/1989 | H01L/21/82 |
| JP | 1-283950 | 11/1989 | H01L/23/52 |
| JP | 2-114548 | 4/1990 | H01L/21/82 |
| JP | 2-244656 | 9/1990 | H01L/21/82 |
| JP | 3-24763 | 2/1991 | H01L/27/118 |
| JP | 4-372169 | 12/1992 | H01L/27/118 |
| JP | 5-29459 | 2/1993 | H01L/21/82 |
| JP | 5-175334 | 7/1993 | H01L/21/82 |

OTHER PUBLICATIONS

H. Sharif et al., Design and Simulations of a Serial–Link Interconnection Network for A Massively Parallel Computer System, Proceedings of the 2$^{nd}$ Int. Workshop on Modeling, Analysis, and Simulation of Comp. and Telecommunication Systems Jun. 1994, p115–119.*

* cited by examiner

Primary Examiner—Vuthe Siek
Assistant Examiner—A. M. Thompson
(74) Attorney, Agent, or Firm—Hayes Soloway P.C.

(57) ABSTRACT

In a method of designing a semiconductor integrated circuit device, there are provided a common block macro for a common circuit and data communication block macros having the same size or different sizes. Each of the data communication block macros is for a data communication circuit. Each of the data communication block macros has a layout pattern for an input terminal of a signal and a layout pattern for an output terminal of the signal at corresponding positions between the data communication block macros. The common block macro has a layout pattern for an output terminal of the signal at a position corresponding to the layout pattern for the input terminal of the data communication block macro. Thereby, a layout pattern of a semiconductor integrated circuit device is formed.

29 Claims, 9 Drawing Sheets

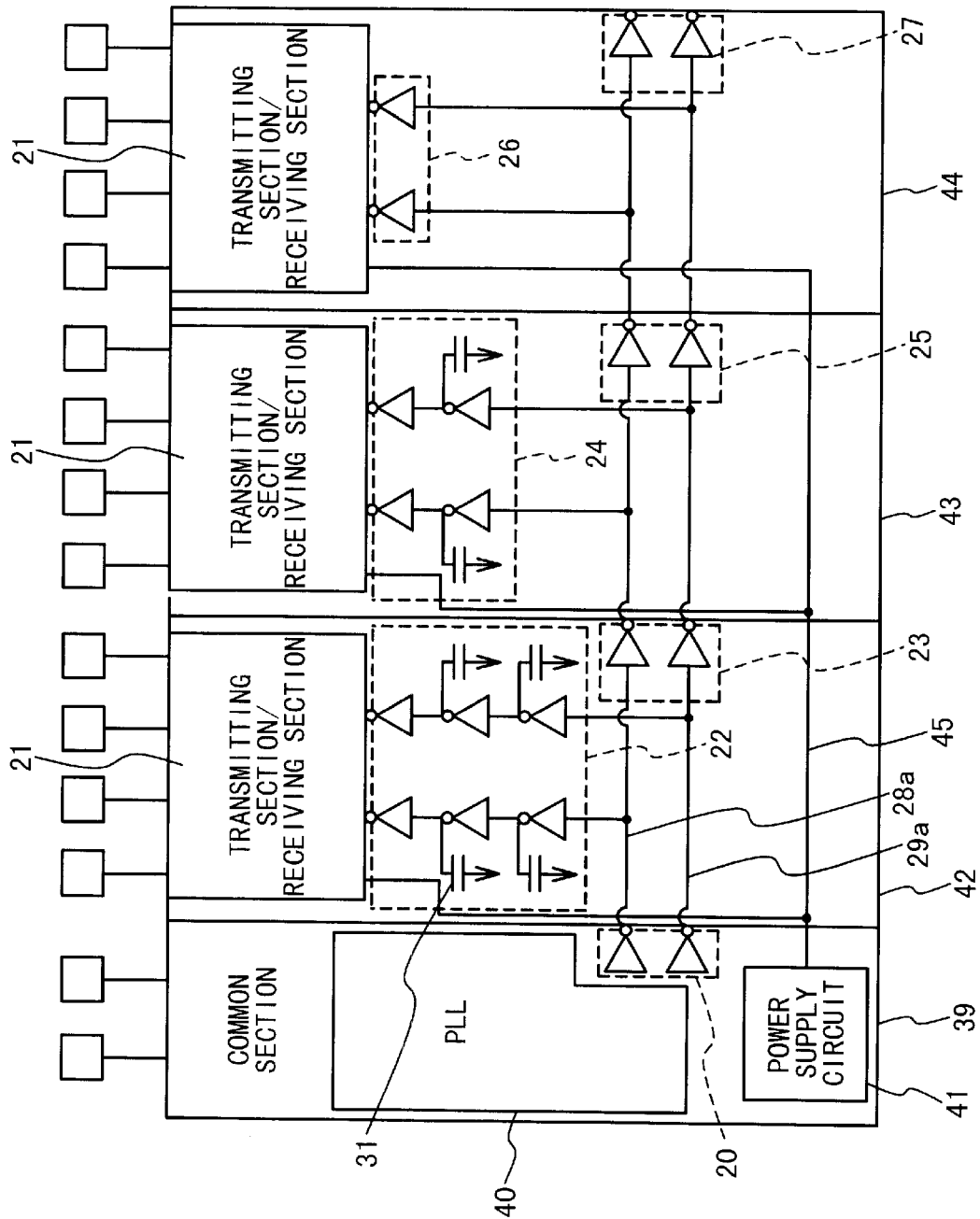

METHOD OF DESIGNING A SEMICONDUCTOR INTEGRATED CIRCUIT DEVICE IN A SHORT TIME

BACKGROUND OF THE INVENTION

1. Field of the Invention

The present invention relates to a method of designing a semiconductor integrated circuit device, and more particularly, to a method of designing an ASIC type semiconductor integrated circuit device.

2. Description of the Related Art

A serial interface is a system for transferring data between LSIs at high speed with a reduced number of cables. For example, as shown in FIG. 1, the serial interface is mounted on an LSI to interconnect functional blocks such as a PLL (Phase Locked Loop) circuit 1, a transmitting section 2, and a receiving section 3.

The PLL circuit 1 inputs a differential clock signal 1a of 125 MHz which is supplied from outside the LSI and increases the differential clock signal 1a to 10 times in frequency to output the 1.25-GHz clock signal 4. At the same time, the PLL circuit 1 outputs the 125-MHz clock signal 5. These clock signals 4 and 5 are supplied to the transmitting section 2 and the receiving section 3 through clock buffers 6. The receiving section 3 inputs a differential serial data signal 3a of 1.25 Gbps and outputs a 10-bit parallel data signal of 125 Mbps. Also, the transmitting section 2 inputs the 10-bit parallel data signal 3c of 125 Mbps and outputs a differential serial data signal 3d of 1.25 Gbps.

Next, the operation of the transmitting section and receiving section will be described below in detail.

First, the structure and operation of the transmitting section 2 will be described.

Referring to FIG. 2, the transmitting section 2 is composed of a 10:1 MUX circuit. The transmitting section 2 is provided with a register 7 composed of flip-flop (F/F) circuits 9, and a shift register 8 composed of flip-flop circuits 10 and selectors 11.

In the transmitting section 2, data 0 to data 9 of 10-bit parallel data 3c are taken in by the register 7 in response to a clock signal 5 of 125 MHz. After that, the data 0 to the data 9 are transferred from the register 7 to the shift register 8 based on the clock signal 4 of 1.25 GHz and a selection signal 8a. In this way, a serial data sequence 3d of 10 bits is obtained.

Next, the structure and operation of receiving section 3 will be described.

As shown in FIG. 3, the receiving section 3 is composed of a 1:10 demultiplexing (DEMUX) circuit with a clock recovery circuit block 12 added. The clock recovery circuit block 12 monitors the switching edge of the received data signal 3a of 1.25 Gbps to generate the 1.25-GHz clock signal with an optimal phase. Thus, the retiming of the received data is carried out. At this time, generally, the clock signal 4 of 1.25 GHz generated by the above mentioned PLL circuit 1 is supplied to the clock recovery circuit block 12 as a reference signal.

In the demultiplexing circuit, the 1.25 Gbps serial data 3a is taken in the shift register 14 in response to a clock signal 13, and then is taken in a register 16 in response to a 125-MHz clock signal 15. Then, the serial data is outputted as the parallel data 3b of 125 Mbps. A frequency divider 14a divides the 1.25-GHz clock signal 13 in frequency to 1/10 to generate the 125-MHz clock signal 15. The reference numerals 17 and 18 are flip-flop circuits of the shift register 14 and register 16, respectively.

The serial interface for one channel is realized for the above mentioned PLL circuit 1, transmitting section 2, and the receiving section 3 to handle transmission data and reception data. However, actually, the serial interfaces for a plurality of channels are often provided for a single LSI.

As shown in FIG. 4, in order to realize this, the circuits such as the PLL circuit 1 are generally common to receiving section/transmitting sections (transmitting section 2 and receiving section 3) for all channels 101. Because the receiving section/transmitting section 101 must be reliably operated for all the channels, the input condition of the clock signals 4 and 5 to the receiving section/transmitting section 101 for the respective channels must be uniformly kept. Therefore, in such a structure, the distribution of the clock signals 4 and 5 from PLL circuit 1 to the receiving section/transmitting sections 101 is important. For this purpose, it is necessary to use a carefully designed clock tree 102.

The clock tree 102 is formed by connecting buffers 6 of a plurality of stages. In this case, wiring line lengths between the stages are made equal to each other, and the structures of paths of the clock tree are made equal to each other so that a clock skew can be reduced.

Therefore, in a conventional ASIC (Application Specific Integrated Circuit) which includes a serial interface circuit, as shown in FIG. 4, the receiving section/transmitting sections 101 and the PLL circuit 1 are described in an ASIC design data base as independent macros. The clock tree 102 is designed specifically for every kind of macro, to connect between them. Also, a wiring line structure for the exclusive use is designed for every kind of macro in case that the circuit which needs a power supply circuit is used for the receiving section/transmitting sections. Also, the wiring line structure for the exclusive use is designed in case that a signal is communicated from the receiving section/transmitting sections to a common section.

When the serial data interface circuit is mounted on the conventional ASIC system semiconductor integrated circuit device as mentioned above, it is necessary to carefully design the semiconductor integrated circuit device for every kind of macro, resulting in a long design turn-around time, and lack in the uniformity of the design quality.

An integrated circuit device is described in Japanese Laid Open Patent Application (JP-A-Showa 60-1845: first conventional example). In this reference, the occupation area of a single chip for a circuit layout pattern having a function has an overlapping shape through a symmetrical conversion.

A method of forming a master slice type integrated circuit device is disclosed in Japanese Laid Open Patent Application (JP-A-Heisei 3-24763: second conventional example). In this reference, a wiring line layout pattern to a pair of function blocks is formed in a point symmetry or in a mirror symmetry. Each of the function blocks is composed of at least one basic cell and the function blocks have the same circuit structure. According to the conventional example, the input/output pin positions of each of the logical function blocks can be arranged in symmetrical positions. Also, the unevenness of the wiring line length which is caused by the position relation of the input/output pins is eliminated. Moreover, when it is requested that the wiring line lengths between the respective logical function blocks are made equal to each other for the parallel processing of a plurality of signals, the influence of the input/output pin position of each logical function block is removed. The unevenness of the wiring line length which is caused by the position relation of the input/output pins is eliminated.

In Japanese Laid Open Patent Application (JP-A-Heisei 4-372169: a third conventional example), a master slice LSI can be obtained. In this reference, a macro cell is composed of terminals which are in the same positions, the same number of basic cells, and a delay element provided between the input terminal and the output terminal on a signal propagation route and having one of a plurality of delay values. Therefore, one macro cell can be easily replaced by another macro cell having the desired delay value. Also, it is not necessary to insert a new delay element once again by carrying out the design again. In addition, a timing error, can be easily eliminated.

In Japanese Laid Open Patent Application (JP-A-Heisei 5-29459: a fourth conventional example), it is described that when a semiconductor substrate area is divided into a plurality of regions for a process of forming wiring lines, wiring line peripheral regions which separate the wiring line regions are set such that a sequence of input/output pins of a hard macro is made parallel, and a connection terminal is provided at the intersection with a perpendicular line from the input/output pin of the hard macro to the wiring line peripheral region.

In Japanese Laid Open Patent Application (JP-A-Heisei 1-283950: a fifth conventional example), a following semiconductor integrated circuit device is described. That is, the layout pattern of an LSI output buffer cell with a scan pass, a shift-in terminal is provided onto the first side of the output buffer cell. A shift-out terminal is provided onto the second side which faces the first side. Terminals other than the above mentioned terminals are arranged on the third side other than the first and second sides to connect with the inside of the LSI chip. The first and second terminals for the feed-through are provided on the second side which faces the first side in the input buffer cell to be connected with each other in the inside the input buffer cell. The positions of the shift-in terminal, shift-out terminal of the above output buffer cell, and the first and second terminals in the input buffer cell are arranged. In this way, when a plurality of output buffer cells are arranged adjacently in a direction, or when a plurality of output buffer cells and a plurality of input buffer cells are arranged adjacently in a direction, the shift-in terminal and the shift-out terminal of each output buffer cell are automatically connected directly or through feed-through terminals in the input buffer cell.

The object of the above fifth conventional example is the deletion of a wiring line area. Therefore, in an output buffer containing a scan pass, a shift-in terminal and a shift-out terminal are arranged on the coordinate with the same height in the sides of the buffer block. Therefore, in the above fifth conventional example, the scan wiring line is connected in the side of the output buffer without passing through the internal area to link the respective output buffers in the order. Therefore, the internal automatic wiring line area can be saved.

However, there is no description on the structure of each block in the above fifth conventional example. The application field is a scan pass structure and the critical timing does not exist. Therefore, a device is not needed in the structure in each block. Even if the above fifth conventional example is applied to the same field as the present invention, the above fifth conventional example does not guarantee the critical timing.

SUMMARY OF THE INVENTION

Therefore, an object of the present invention is to provide a method of designing a semiconductor integrated circuit device simply and surely, and a semiconductor integrated circuit device manufactured by the same.

Another object of the present invention is to provide a method of designing a semiconductor integrated circuit device with a multi-channel serial interface circuit to provide stable characteristics and a semiconductor integrated circuit device manufactured by the same.

Still another object of the present invention is to provide a method of designing a semiconductor integrated circuit device by use of less libraries, and a semiconductor integrated circuit device manufactured by the same.

Yet still another object of the present invention is to provide a method of designing a semiconductor integrated circuit device by providing layout patterns for terminals at corresponding positions, and a semiconductor integrated circuit device manufactured by the same.

It is also an object of the present invention to provide a recording medium storing a program for either of the above methods.

In order to achieve an aspect of the present invention, a method of designing a semiconductor integrated circuit device is carried out by providing a common block macro for a common circuit and data communication block macros, and arranging the common block macro and the data communication block macros to form a layout pattern of a semiconductor integrated circuit device. Each of the data communication block macros is for a data communication circuit. Each of the data communication block macros has a layout pattern for an input terminal for a signal and a layout pattern for an output terminal for the signal at corresponding positions between the data communication block macros. Also, the common block macro has a layout pattern for an output terminal for the signal at a position corresponding to the layout pattern for the input terminal of the data communication block macro.

Here, the signal may be a clock signal. In this case, the common block macro desirably includes a layout pattern for a clock driver. Also, the common block macro may include a layout pattern for a PLL (Phase Locked Loop) circuit.

Also, the signal may be a reference voltage signal indicative of a reference voltage. In this case, the common block macro may include a layout pattern for a reference voltage generating circuit which generates the reference voltage.

Also, each of the data communication block macros may have a first layout pattern for the data communication circuit, and a second layout pattern for a transfer section for the signal. At this time, the transfer section may include a first wiring line connected to the input terminal, and a first buffer connected between the first wiring line and the output terminal. The transfer section may further include a second wiring line connected to the first wiring line, and a buffering section having at least one second buffer and provided between the data communication circuit and the second wiring line. In this case, the arranging of the data communication block macros is carried out based on the number of second buffers. It is desirable that a summation of the number of the first buffers and the number of the second–buffers from the common circuit to the data communication circuit in each of the data communication block macros is the same between the data communication block macros. In addition, it is desirable that a summation of the first and second wiring lines in length from the common circuit to the data communication circuit in each of the data communication block macros is the same between the data communication block macros. The buffering section may include a plurality of the second buffers, and each of the plurality of second buffers is connected with a capacitor corresponding to the first buffer other than one second buffer.

In order to achieve another aspect of the present invention, a method of designing a semiconductor integrated circuit device is carried out by providing a common block macro for a common circuit, a data communication circuit macro for a data communication circuit, and transfer section macros for transfer sections, by arranging the common block macro in an area, and by arranging sets of the data communication circuit macro and one of the transfer section macros in other areas, respectively, to form a layout pattern of a semiconductor integrated circuit device. Each of the transfer section macros has a layout pattern for an input terminal of a signal and a layout pattern for an output terminal of the signal at corresponding positions between the transfer section macros. The common block macro has a layout pattern for an output terminal of the signal at a position corresponding to the layout pattern for the input terminal of the transfer section macro.

Here, the signal may be a clock signal. In this case, the common block macro desirably includes a layout pattern for a clock driver. Also, the common block macro desirably includes a layout pattern for a PLL (Phase Locked Loop) circuit.

Also, the signal may be a reference voltage signal indicative of a reference voltage. In this case, the common block macro may include a layout pattern for a reference voltage generating circuit which generates the reference voltage.

Also, the transfer section may include a first wiring line connected to the input terminal, a first buffer connected between the first wiring line and the output terminal, a second wiring line connected to the first wiring line, and a buffering section having at least one second buffer and provided between the communication circuit and the second wiring line. In this case, the arranging of the sets of the data communication circuit macro and the one transfer section macro is carried out based on the number of the second buffers. At this time, it is desirable that a summation of the number of the first buffers and the number of the second buffers from the common circuit to the data communication circuit is the same between the sets of the data communication circuit macro and the one transfer section macro. In addition, it is desirable that a summation of the first and second wiring lines in length from the common circuit to the data communication circuit is the same between the sets of the data communication circuit macro and the one transfer section macro.

Also, when the buffering section includes a plurality of the second buffers, each of the second buffers may be connected with a capacitor corresponding to the first buffer other than one second buffer.

In order to achieve still another aspect of the present invention, there is provided a recording medium storing a program for a method of designing a semiconductor integrated circuit device. At this time, a method of designing a semiconductor integrated circuit device is carried out by providing a common block macro for a common circuit and data communication block macros, and arranging the common block macro and the data communication block macros to form a layout pattern of a semiconductor integrated circuit device. Each of the data communication block macros is for a data communication circuit. Each of the data communication block macros has a layout pattern for an input terminal for a signal and a layout pattern for an output terminal for the signal at corresponding positions between the data communication block macros. Also, the common block macro has a layout pattern for an output terminal for the signal at a position corresponding to the layout pattern for the input terminal of the data communication block macro.

Here, the signal may be a clock signal. In this case, the common block macro desirably includes a layout pattern for a clock driver. Also, the common block macro may include a layout pattern for a PLL (Phase Locked Loop) circuit.

Also, the signal may be a reference voltage signal indicative of a reference voltage. In this case, the common block macro may include a layout pattern for a reference voltage generating circuit which generates the reference voltage.

Also, each of the data communication block macros may have a first layout pattern for the data communication circuit, and a second layout pattern for a transfer section for the signal. At this time, the transfer section may include a first wiring line connected to the input terminal, and a first buffer connected between the first wiring line and the output terminal. The transfer section may further include a second wiring line connected to the first wiring line, and a buffering section having at least one second buffer and provided between the data communication circuit and the second wiring line. In this case, the arranging of the data communication block macros is carried out based on the number of second buffers. It is desirable that a summation of the number of the first buffers and the number of the second buffers from the common circuit to the data communication circuit in each of the data communication block macros is the same between the data communication block macros. In addition, it is desirable that a summation of the first and second wiring lines in length from the common circuit to the data communication circuit in each of the data communication block macros is the same between the data communication block macros. The buffering section may include a plurality of the second buffers, and each of the plurality of second buffers is connected with a capacitor corresponding to the first buffer other than one second buffer.

In order to achieve yet still another aspect of the present invention, a method of designing a semiconductor integrated circuit device is carried out by providing a common block macro for a common circuit, a data communication circuit macro for a data communication circuit, and transfer section macros for transfer sections, by arranging the common block macro in an area, and by arranging sets of the data communication circuit macro and one of the transfer section macros in other areas, respectively, to form a layout pattern of a semiconductor integrated circuit device. Each of the transfer section macros has a layout pattern for an input terminal of a signal and a layout pattern for an output terminal of the signal at corresponding positions between the transfer section macros. The common block macro has a layout pattern for an output terminal of the signal at a position corresponding to the layout pattern for the input terminal of the transfer section macro.

Here, the signal may be a clock signal. In this case, the common block macro desirably includes a layout pattern for a clock driver. Also, the common block macro desirably includes a layout pattern for a PLL (Phase Locked Loop) circuit.

Also, the signal may be a reference voltage signal indicative of a reference voltage. In this case, the common block macro may include a layout pattern for a reference voltage generating circuit which generates the reference voltage.

Also, the transfer section may includes a first wiring line connected to the input terminal, a first buffer connected between the first wiring line and the output terminal, a second wiring line connected to the first wiring line, and a buffering section having at least one second buffer and provided between the communication circuit and the second wiring line. In this case, the arranging of the sets of the data communication circuit macro and the one transfer section macro is carried out based on the number of the second buffers. At this time, it is desirable that a summation of the number of the first buffers and the number of the second buffers from the common circuit to the data communication circuit is the same between the sets of the data communication circuit macro and the one transfer section macro. In addition, it is desirable that a summation of the first and second wiring lines in length from the common circuit to the data communication circuit is the same between the sets of the data communication circuit macro and the one transfer section macro.

Also, when the buffering section includes a plurality of the second buffers, each of the second buffers may be connected with a capacitor corresponding to the first buffer other than one second buffer.

BRIEF DESCRIPTION OF THE DRAWINGS

FIG. 9 is a circuit block diagram showing the structure of the semiconductor integrated circuit device according to a fifth embodiment of the present invention.

DESCRIPTION OF THE PREFERRED EMBODIMENTS

Hereinafter, a method of designing a semiconductor integrated circuit device of the present invention will be described with reference to the attached drawings.

Figure 1:
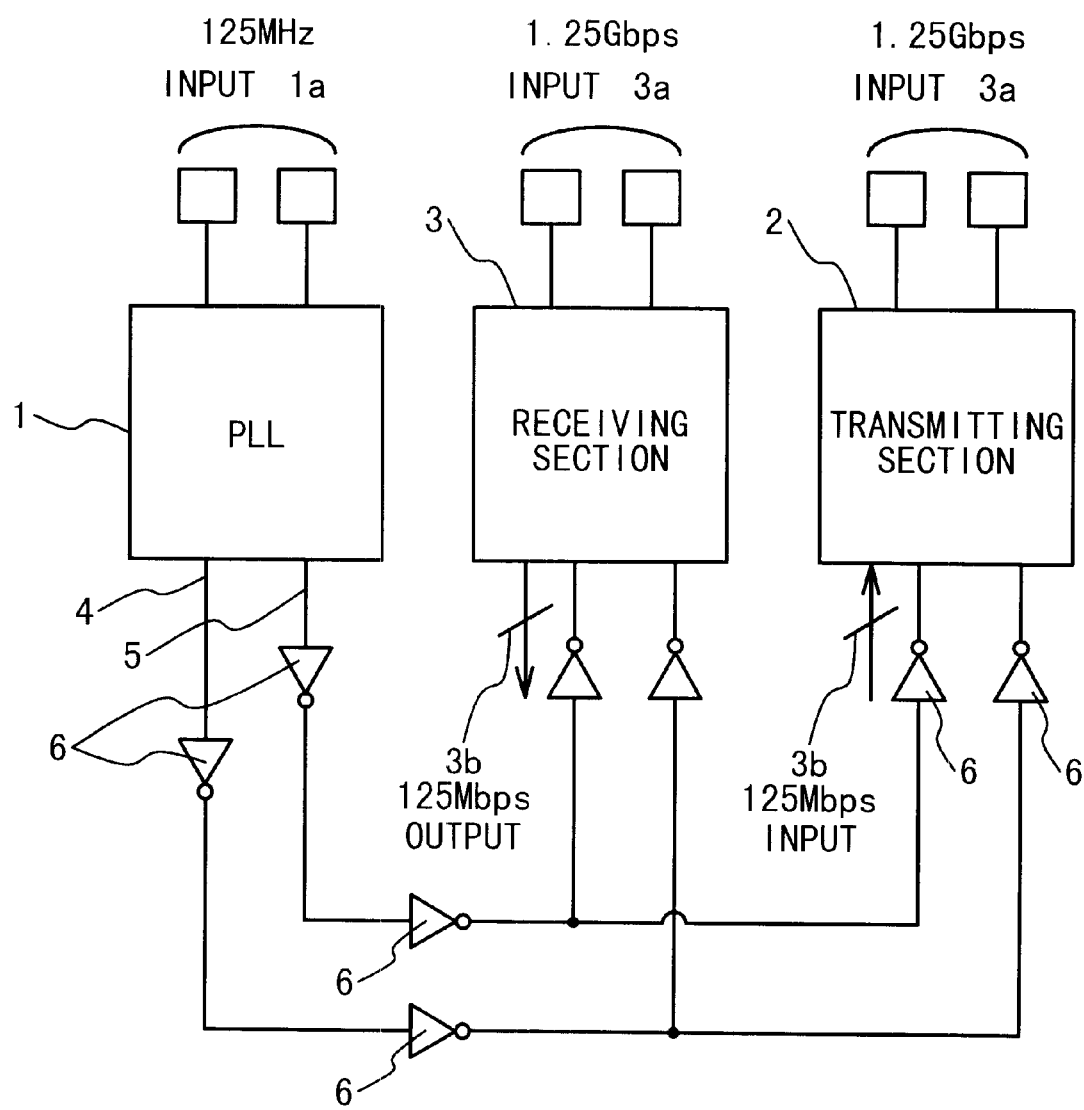
FIG. 1 is a circuit block diagram showing the structure of a conventional semiconductor integrated circuit device in which a 1-channel serial interface is realized.
Figure 2:
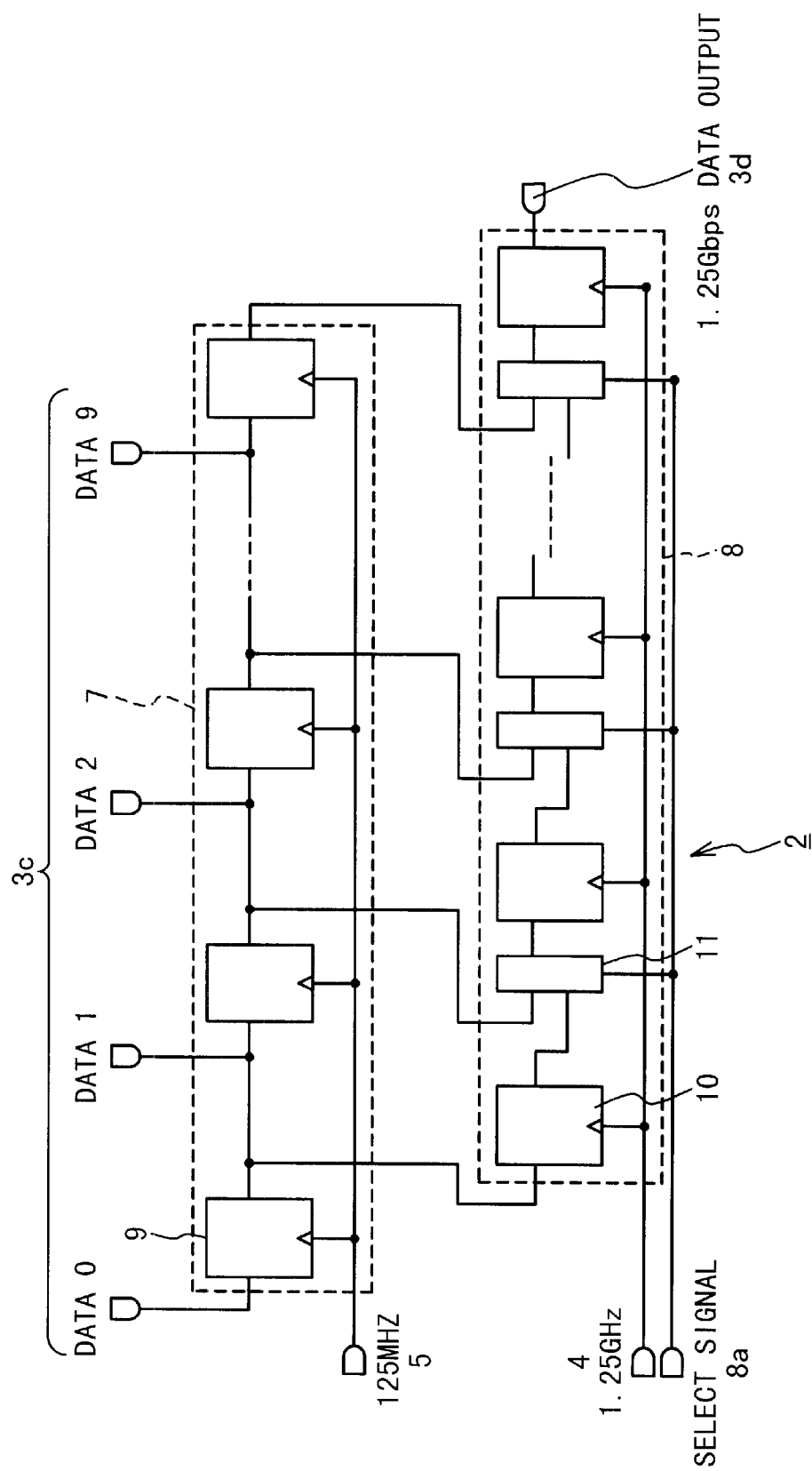
FIG. 2 is a circuit block diagram showing the structure of a transmitting section of the conventional semiconductor integrated circuit device shown in FIG. 1.
Figure 3:
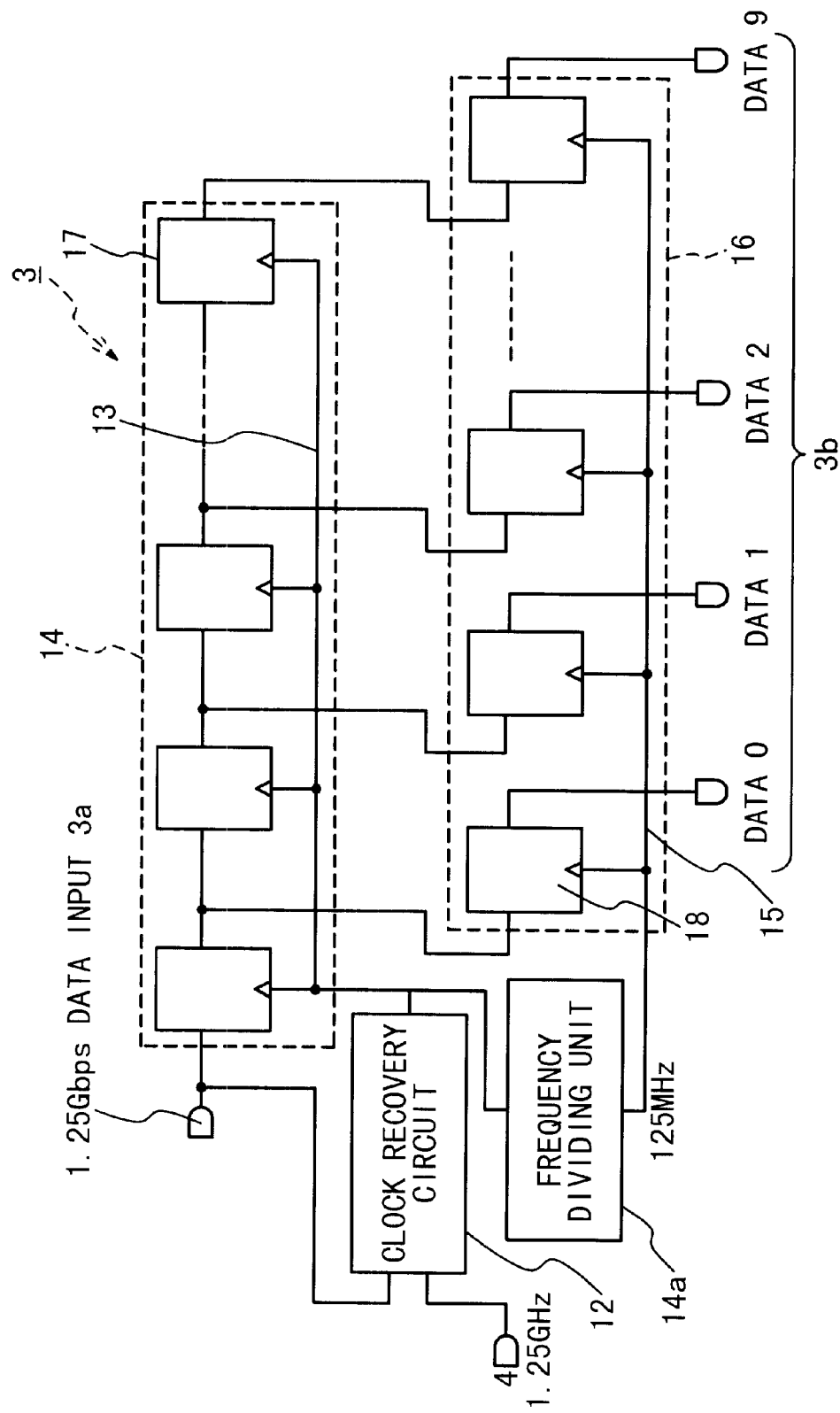
FIG. 3 is a circuit block diagram showing the structure of the receiving section of the conventional semiconductor integrated circuit device shown in FIG. 1.
Figure 4:
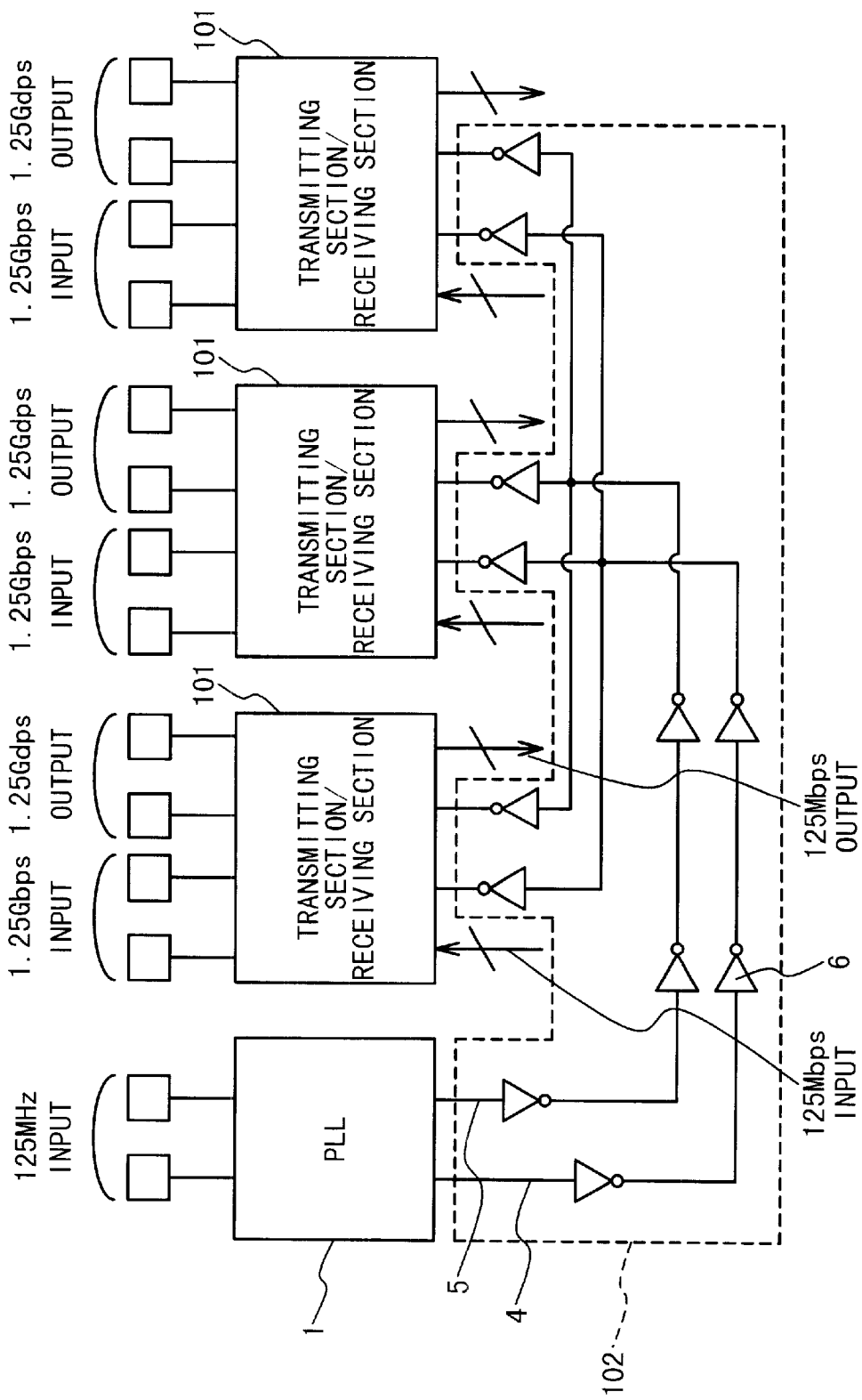
FIG. 4 is a circuit block diagram showing the structure of a conventional semiconductor integrated circuit device in which a multi-channel serial interface is realized.
Figure 5:
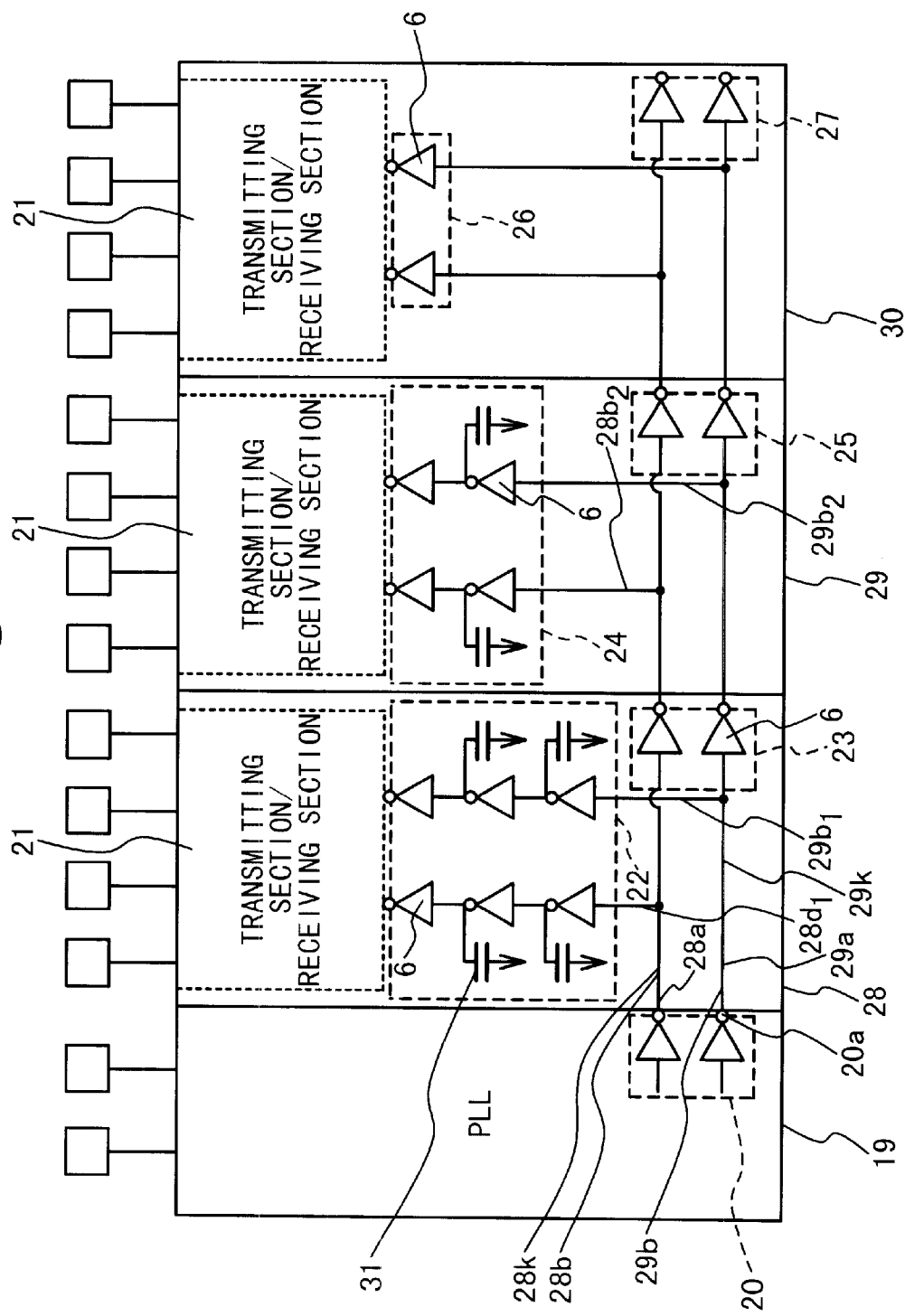
FIG. 5 is a circuit block diagram showing the structure of a semiconductor integrated circuit device according to a first embodiment of the present invention.

FIG. 5 is a block diagram showing the semiconductor integrated circuit device according to the first embodiment of the present invention. The semiconductor integrated circuit device in this embodiment is an ASIC provided with a 3-channel serial interface. In the semiconductor integrated circuit device in this embodiment, a PLL block (common block) 19, and a plurality of serial port blocks (data communication block) 28, 29 and 30 are arranged adjacent to each other. Each of the serial port blocks 28, 29 and 30 contains a receiving section/transmitting section 21 and clock buffering circuits 22 to 27.

It should be noted that various embodiments of the present invention will be shown below. However, the structures of the PLL block and each serial port block are shown only in a main body. For example, details such as parallel data transmission lines in each serial port block are not shown.

The PLL block 19 contains a PLL circuit and a clock buffer 20. Output terminals 20a in the clock buffer 20 are arranged in the end portion of the PLL block 19. The receiving section/transmitting section 21 is formed in each of the serial port blocks 28 to 30. However, in the serial port blocks 28 to 30, the structure of each of the clock buffering circuits 22 to 27 is as follows.

First, a macro cell for the serial port block 28 will be described. The serial port block 28 is arranged adjacent to the PLL block 19. The clock buffering circuit 22 transfers clock signals 28b and 29b from the clock driver 20 in the PLL block 19 to the receiving section/transmitting section 21. The clock buffering circuit 22 is composed of buffers 6 of 3 stages. The serial port block 28 is further provided with a clock buffer 23 (buffers 6) to transfer the clock signals 28b and 29b from the PLL block 19 to a neighbor serial port block 29.

In the clock buffering circuit 22, because the fan-out of each buffer is set to two, a dummy capacity 31 is added as the load of each of the buffers 6 of the first and second stages. This is to adjust the signal transfer condition of the lock signals 28b and 29b by making the number of branches of the clock signal lines 28a and 29a constant. Moreover, although not illustrated, the wiring lengths between the respective buffers 6 are made equal in advance.

The clock signal lines 28a and 29a connected with the output terminal 20a of the clock buffer 20, are branched into two directions in each of the serial port blocks 28, 29 and 30. For example, a base section 28k of the clock signal line 28a is branched and a first branch section 28d1 is connected with the receiving section/transmitting section 21 of the serial port block 28. The base section 28k is led to the neighbor serial port block 29 through the buffer 6. A second branch section 28d2 is branched from the base section 28k, and the branch line 28d2 is connected with the receiving section/transmitting section 21 of the serial port block 29. The same is applied to the clock signal line 29a (see the reference numerals 29k, 29d1, 29d2).

Next, the serial port block 29 will be described.

The serial port block 29 is arranged in the neighbor to the serial port block 28. The clock buffering circuit 24 is composed of the buffers 6 of 2 stages to transfer the clock signals 28b and 29b from the clock driver 23 in the serial port block 28 to the receiving section/transmitting section 21 of the serial port block 29.

Moreover, the serial port block 29 is provided with a clock buffer 25 (buffers 6) to transfer the clock signals 28b and 29b from the serial port block 28 to a neighbor serial port block 30.

In the clock buffering circuit 24, in order to set the fan-out of the buffer to two, a dummy capacity 31 is added as the load of the buffer 6 of the first stage. Moreover, although being not illustrated, the wiring lengths between the respective buffer 6 are made equal to each other in advance.

Next, the serial port block 30 will be described. The serial port block 30 is arranged near the serial port block 29 and in the farthest position from the PLL block 19.

The clock buffering circuit 26 is composed of the buffers 6 of 1 stage to transfer the clock signals 28b and 29b from the clock driver 25 in the serial port block 29 to the receiving section/transmitting section 21 of the serial port block 30. The serial port block 30 is provided with a load clock buffer 27 to adjust the fan-out of the clock buffer 25 in the serial port block 29 to two.

The serial port blocks 28 to 30 and the PLL block 19 are previously prepared as the macros to have the above structures. In this case, the number of clock buffering stages, i.e., the number of buffer stages 6 can be all unified to 3 stages. In this way, the clock signals 28b and 29b can be transferred with the same load from the PLL block 19 which is used in common to all the serial port blocks 28 to 30, to the receiving section/transmitting sections 21 of the serial port blocks 28 to 30. Therefore, the clock signal transfer time from the PLL block 19 to each of the serial port blocks 28 to 30, and the waveforms of the clock signals at the input terminals of the respective transmission/receiving sections 21 can be made completely equal to each other.

When the number of channels is set to 2 channels, the PLL block 19 and the serial port blocks 29 and 30 are only arranged in the neighbor as in the above case. Thus, the uniform clock waveform can be supplied to each of the serial port blocks 29 and 30.

That is, when the serial interface of the N channels is realized on ASIC, the serial port macros with the different clock buffering stages from one stage to N stages are prepared previously. The serial port block macros are arranged near a macro for the PLL block 19.

When the macros of the PLL block 19 and serial port blocks 28 to 30 are sequentially and adjacently arranged, the output terminals 20a of the PLL block 19 are automatically connected to the input terminals of the serial port block 28 and the output terminals of one of the serial port blocks 28 to 30 are automatically connected to the input terminals of the next one of the serial port blocks 29 and 30.

As described above, in each of the serial port block macros 28, 29 and 30, the clock signal buffering circuit is previously incorporated. The PLL block macro 19 is common to the serial port block macros 28, 29 and 30. Such macros are previously prepared. Also, these macros 19, 28, 29 and 30 are arranged near each other such that the terminals of the macros 19, 28, 29 and 30 can be connected one after another. In this way, it is possible to make the serial interface circuit of the multi-channel.

One of the serial port block macros 28, 29 and 30 having the suitable number of buffering stages is selected in according to the distance from the common macro 19. Because it is not necessary to carry out the buffering of the clock signal for every kind of ASIC, the multi-channel serial interface ASIC can be completed to have stable performance in a very short term.

In the first embodiment, the serial port block macros 28, 29 and 30 have the same size. However, the serial port block macros 28, 29 and 30 have different sizes from each other.

Also, in the first embodiment, the number of buffers 6 from the common macro 19 to the transmitting section/receiving section 21 is the same between the serial port block macros 28, 29 and 30. This is because the serial port block macros 28, 29 and 30 are different in the number of buffers 6. Therefore, if the serial port block macros 28, 29 and 30 have the same number of buffers 6, the delay times are different. However, when the serial port block macros 28, 29 and 30 have the same layout pattern, only one library is required for the serial port block macros. In this case, the design becomes easier although there is the problem of the delay time.

Next, the second embodiment of the present invention will be described.

Figure 6:
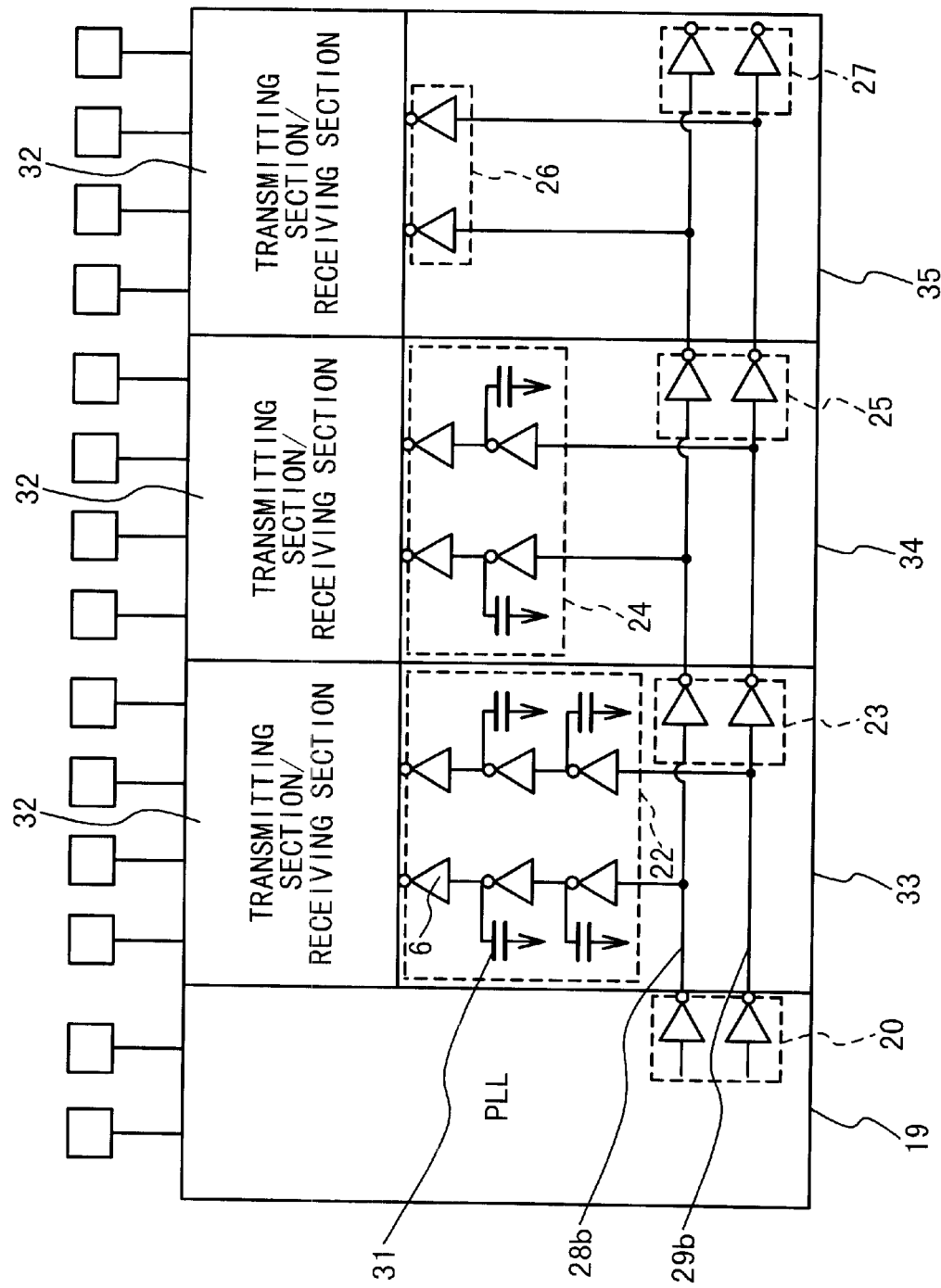
FIG. 6 is a circuit block diagram showing the structure of the semiconductor integrated circuit device according to a second embodiment of the present invention.

FIG. 6 is a block diagram showing the structure of the semiconductor integrated circuit according to the second embodiment of the present invention.

The semiconductor integrated circuit in this embodiment has the structure in which the receiving section/transmitting section 21 and a clock tree section of the serial port block 28 to 30 in the first embodiment are separated. That is, in the serial port block 28, a receiving section/transmitting section block 32 and a clock buffering block 33 are separated. Also, in the serial port block 29, a receiving section/transmitting section block 32 and clock buffering block 34 are separated. Also, in the serial port block 30, a receiving section/transmitting section block 32 and a clock buffering block 35 are separated.

The terminal positions of the clock buffering blocks 33 to 35, PLL block 19 and receiving section/transmitting section block 32 are determined to be connected to each other when the blocks 33 to 35, 19, and 32 are arranged near each other.

The final structure is the same as that of the first embodiment. However, according to the second embodiment, it is sufficient to prepare only one macro of the receiving section/transmitting section block 32 which has a larger amount of data of ASIC libraries. Various macros as libraries are prepared for the clock tree sections 33 to 35 which have a small amount of data. Thus, it is possible to cut down the file capacity of the ASIC libraries so that the data management becomes easy.

Figure 7:
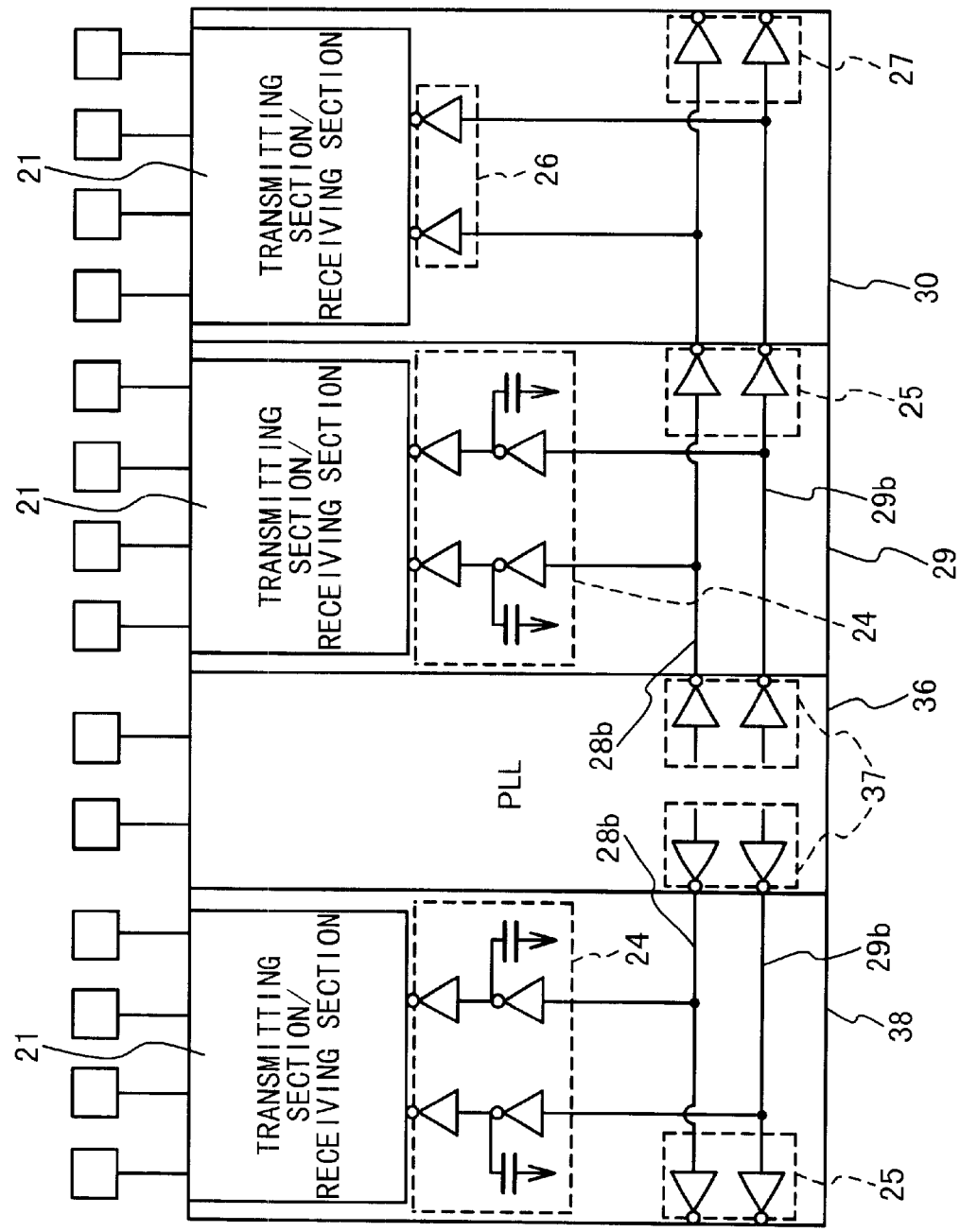
FIG. 7 is a circuit block diagram showing the structure of the semiconductor integrated circuit device according to a third embodiment of the present invention.

FIG. 7 is a block diagram showing the structure of the semiconductor integrated circuit according to the third embodiment of the present invention. Referring to FIG. 7, the semiconductor integrated circuit in the third embodiment will be described below.

In a PLL block 36, clock drivers 37 are arranged on both sides of the macro. The serial port block 29 is arranged on the right side of the PLL block 36. A serial port block 38 is arranged on the left side of the PLL block 36, wherein the serial port block 38 is symmetrical with the serial port block 29 with respect to the PLL block 36. Because the vertical coordinate of the clock buffer does not change even if the serial port block 38 is arranged on the left side, the connection of the PLL block 36 with the serial port blocks 29 and 38 on either side is kept good.

Moreover, the serial port block 30 is arranged to contact the serial port block 29. In the third embodiment, the clock signals 28b and 29b are transferred from the PLL block 36 to the receiving sections/transmitting sections 21 in the serial port block 29, 30 and 38. In this case, the number of buffer stages for the clock signals 28b and 29b is unified to be 2 stages.

In the third embodiment, the distance between the PLL block 36 and each of the serial port block 29, 30 and 38 can be made short. Therefore, the device deviation due to elements in the chip and the influence of the power supply line potential dropping can be suppressed to the minimum, so that an ASIC mounting the serial interface circuit can be more precisely realized.

Figure 8:
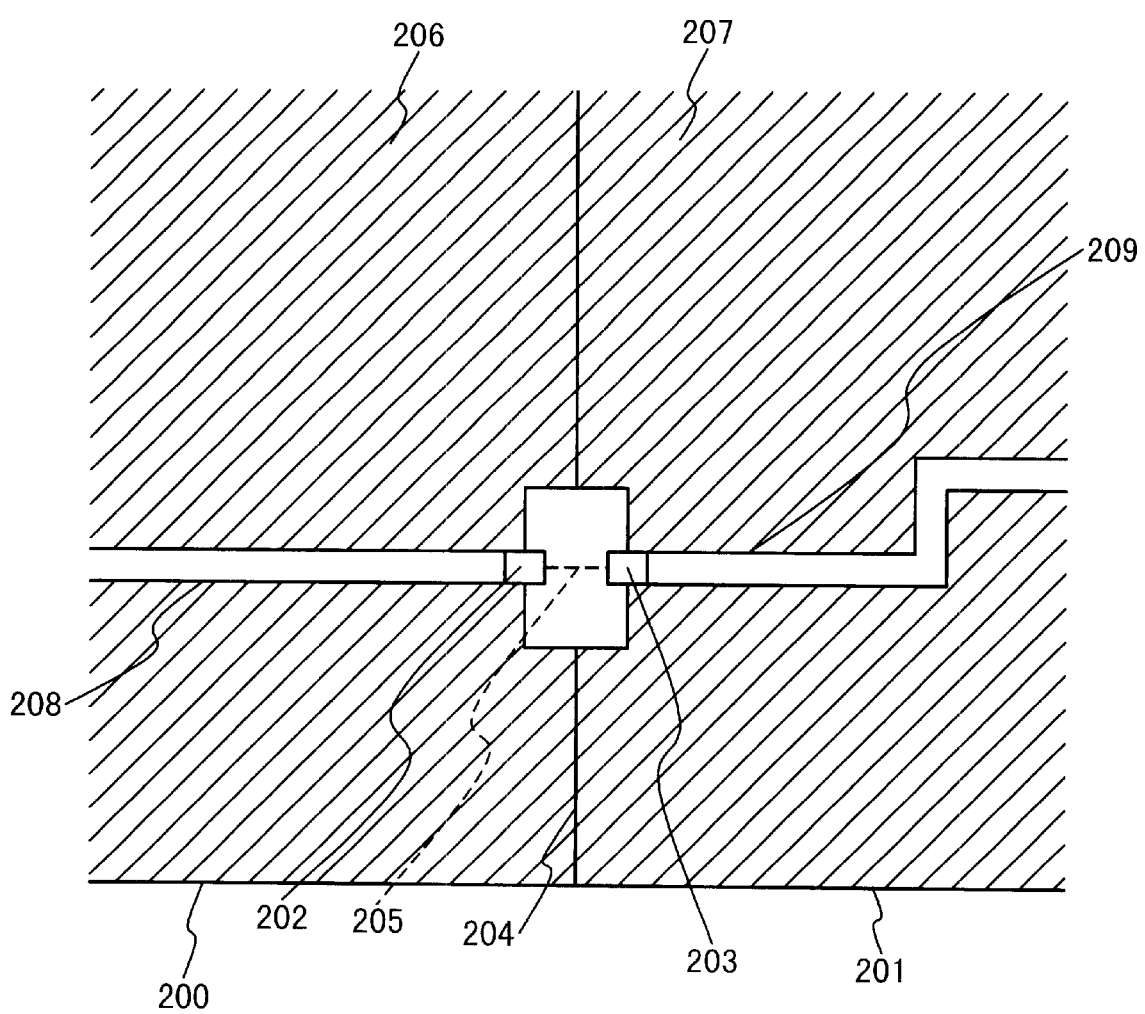
FIG. 8 is a circuit block diagram showing the structure of the semiconductor integrated circuit device according to a fourth embodiment of the present invention.

FIG. 8 is an expanded view of a peripheral portion of the terminal in the semiconductor integrated circuit according to the fourth embodiment of the present invention wherein a PLL block 200 and a serial port block 201 are in contact.

In the fourth embodiment, the terminal 202 in the PLL block 200 and the terminal 203 in the serial port block 201 are positioned slightly inside from a macro boundary 204. It is desirable that the distance between macro boundary 204 and each of the terminal 202 and 203 is one or two of automatic wiring line tool lattices of the ASIC production.

Moreover, all peripheral areas 206 and 207 are defined as prohibition areas of wiring line arrangement in the library for an automatic wiring line tool such that only the shortest route 205 is permitted for a wiring line channel 205 between the neighbor terminals 202 and 203.

The terminals 202 and 203 are connected with a wiring line 208 from a clock driver (not shown) in the PLL block 200 and the wiring line 209 to a clock buffer (not shown) in the serial port block 201, respectively.

FIG. 8 shows a case where the PLL block 200 and the serial port block 201 are near each other. The similar structure can be adopted at positions where the serial port blocks are in contact with each other.

It is supposed that the above-mentioned PLL block 200 and serial port block 201 are used. In this case, connection between the PLL block 200 and the serial port block 201 is described in a net list indicating the circuit connection information as independent blocks. The described net is realized as a wiring line layout pattern 205 between the terminals 202 and 203 by the automatic wiring line tool. Therefore, when the PLL block 200 and various serial port blocks 201 are provided as libraries independently, the adjustment between the net list and the layout pattern can be easily attained.

Moreover, the wiring line 205 between the blocks 200 and 201 has the shortest size which can be expected. Therefore, the wiring line delay time of this portion can be fully described previously into the library for each block. That is, a uniform characteristic is attained regardless of the kind of the ASIC product. Also, there is no necessity for the delay verification after the automatic wiring line process.

It could be understood that the fourth embodiment can be applied to the above first to third embodiments.

A case is described where only a clock signal line is supplied from the PLL block to each serial port block. As in the semiconductor integrated circuit of the fourth embodiment shown in FIG. 9, even when a reference voltage generated by a power supply circuit is supplied to each of the serial port blocks 42 to 44, the PLL circuit 40 and the power supply circuit 41 can be installed in a common block 39. Also, a reference power supply line 45 can be arranged in each of the serial port blocks 42 to 44 together with the clock signal lines 28a and 29a.

Also, it is possible in the same way when another signal exists between the common block and the serial port block.

Moreover, in the above embodiments, the case where various signals are supplied from the common block to each serial port block is described. It would be apparent that the present invention can be applied to the case where a signal is supplied from each of the serial port blocks to the common block.

It should be noted that the design method of the semiconductor integrated circuit device of the present invention may be a master slice method in which elements arranged on a silicon substrate are connected to attain a desired logical function. Also, the present invention may be applied to a standard cell method in which blocks which have logical functions are arranged and connected to attain a desired logical function.

Also, the above designing method of the semiconductor integrated circuit device may be provided in the form of a recording medium storing a program for the method.

As described above, in the present invention, there are prepared one or more types of PLL (common) macros and one or more types of macros to have the receiving section/transmitting section in which a clock tree structure is previously embedded. The terminals of each macro are arranged in the positions such that the neighbor macros are connected to each other with no wiring operation or in the minimum wiring line, when the macros are arranged in contact with one another. Therefore, it is possible to provide the serial interface ASIC with good characteristics in a very simple, reliable method.

What is claimed is:

1. A method of designing a semiconductor integrated circuit device, comprising:

providing a common block macro for a common circuit and data communication block macros, said common block macro including a layout pattern for a clock driver and a layout pattern for a PLL (Phase Locked Loop) circuit, wherein each of said data communication block macros is for a data communication circuit, and each of said data communication block macros has a layout pattern for an input terminal for a clock signal and a layout pattern for an output terminal for said clock signal at corresponding positions between said data communication block macros, and said common block macro has a layout pattern for an output terminal for said clock signal at a position corresponding to said layout pattern for said input terminal of said data communication block macro; and arranging said common block macro and said data communication block macros to form a layout pattern of a semiconductor integrated circuit device.

2. A method according to claim 1, wherein said common block macro includes a layout pattern for a reference voltage generating circuit which generates said reference voltage.

3. A method of designing a semiconductor integrated circuit device, comprising:

providing a common block macro for a common circuit and data communication block macros, wherein each of said data communication block macros is for a data communication circuit, and each of said data communication block macros has a layout pattern for an input terminal for a signal and a layout pattern for an output terminal for said signal at corresponding positions between said data communication block macros, and said common block macro has a layout pattern for an output terminal for said signal at a position corresponding to said layout pattern for said input terminal of said data communication block macro; and arranging said common block macro and said data communication block macros to form a layout pattern of a semiconductor integrated circuit device, wherein each of said data communication block macros has a first layout pattern for said data communication circuit, and a second layout pattern for a transfer section for said signal, and wherein said transfer section includes:

a first wiring line connected to said input terminal; and a first buffer connected between said first wiring line and said output terminal.

4. A method according to claim 3, wherein said transfer section further includes:

a second wiring line connected to said first wiring line; and a buffering section having at least one second buffer and provided between said data communication circuit and said second wiring line.

5. A method according to claim 4, wherein said arranging of said data communication block macros is carried out based on the number of second buffers.

6. A method according to claim 5, wherein a summation of the number of said first buffers and the number of said second buffers from said common circuit to said data communication circuit in each of said data communication block macros is same between said data communication block macros.

7. A method according to claim 6, wherein a summation of the length of said first and second wiring lines from said common circuit to said data communication circuit in each of said data communication block macros is the same between said data communication block macros.

8. A method according to claim 4, wherein said buffering section includes a plurality of said second buffers, and each of said plurality of second buffers is connected with a capacitor corresponding to said first buffer other than one second buffer.

9. A method of designing a semiconductor integrated circuit device, comprising:

providing a common block macro for a common circuit, a data communication circuit macro for a data communication circuit, and transfer section macros for transfer sections, wherein each of said transfer section macros has a layout pattern for an input terminal of a signal and a layout pattern for an output terminal of said signal at corresponding positions between said transfer section macros, and said common block macro has a layout pattern for an output terminal of said signal at a position corresponding to said pattern for said input terminal of said transfer section macro;

arranging said common block macro in an area; and arranging sets of said data communication circuit macro and one of said transfer section macros in other areas, respectively, to form a layout pattern of a semiconductor integrated circuit device.

10. A method according to claim 9, wherein said signal is a clock signal.

11. A method according to claim 10, wherein said common block macro includes a layout pattern for a clock driver.

12. A method according to claim 11, wherein said common block macro includes a layout pattern for a PLL (Phase Locked Loop) circuit.

13. A method according to claim 9, wherein said signal is a reference voltage signal indicative of a reference voltage.

14. A method according to claim 13, wherein said common block macro includes a layout pattern for a reference voltage generating circuit which generates said reference voltage.

15. A method according to claim 9, wherein said transfer section includes:

a first wiring line connected to said input terminal;

a first buffer connected between said first wiring line and said output terminal;

a second wiring line connected to said first wiring line; and a buffering section having at least one second buffer and provided between said communication circuit and said second wiring line.

16. A method according to claim 15, wherein said arranging of the sets of said data communication circuit macro and said one transfer section macro is carried out based on the number of said second buffers.

17. A method according to claim 16, wherein a summation of the number of said first buffers and the number of said second buffers from said common circuit to said data communication circuit is the same between said sets of said data communication circuit macro and said one transfer section macro.

18. A method according to claim 17, wherein a summation of the length of said first and second wiring lines from said common circuit to said data communication circuit is the same between said sets of said data communication circuit macro and said one transfer section macro.

19. A method according to claim 15, wherein said buffering section includes a plurality of said second buffers, and each of said second buffers is connected with a capacitor corresponding to said first buffer other than one second buffer.

20. A recording medium storing a program for a method of designing a semiconductor integrated circuit device said program executing said method which comprises:

providing a common block macro for a common circuit and data communication block macros, said common block macro including a layout pattern for a clock driver and a layout pattern for a PLL (Phase Locked Loop) circuit, wherein each of said data communication block macros is for a data communication circuit, and each of said data communication block macros has a layout pattern for an input terminal of a clock signal and a layout pattern for an output terminal of said clock signal at corresponding positions between said data communication block macros, and said common block macro has a layout pattern for an output terminal of said clock signal at a position corresponding to said layout pattern for said input terminal of said data communication block macro; and arranging said common block macro and said data communication block macros to form the semiconductor integrated circuit device.

21. A recording medium according to claim 20, wherein said signal is a reference voltage signal indicative of a reference voltage.

22. A recording medium storing a program for a method of designing a semiconductor integrated circuit device said program executing said method which comprises:

providing a common block macro for a common circuit and data communication block macros, wherein each of said data communication block macros is for a data communication circuit, and each of said data communication block macros has a layout pattern for an input terminal of a signal and a layout pattern for an output terminal of said signal at corresponding positions between said data communication block macros, and said common block macro has a layout pattern for an output terminal of said signal at a position corresponding to said layout pattern for said input terminal of said data communication block macro;

wherein said signal is a reference voltage signal indicative of a reference voltage, and said common block macro includes a layout pattern for a reference voltage generating circuit which generates said reference voltage, and arranging said common block macro and said data communication block macros to form the semiconductor integrated circuit device.

23. A recording medium storing a program for a method of designing a semiconductor integrated circuit device, said programs executing said method which comprises:

providing a common block macro for a common circuit and data communication block macros, wherein each of said data communication block macros is for a data communication circuit, and each of said data communication block macros has a layout pattern for an input terminal of a signal and a layout pattern for an output terminal of said signal at corresponding positions between said data communication block macros, and said common block macro has a layout pattern for an output terminal of said signal at a position corresponding to said layout pattern for said input terminal of said data communication block macro;

wherein each of said data communication block macros has a first layout pattern for said data communication circuit, and a second layout pattern for a transfer section for said signal, and wherein said transfer section includes:
 a first wiring line connected to said input terminal; and
 a first buffer connected between said first wiring line and said output terminal, and
 arranging said common block macro and said data communication block macros to form the semiconductor integrated circuit device.

24. A recording medium according to claim 23, wherein said transfer section further includes:
 a second wiring line connected to said first wiring line; and
 a buffering section having at least one second buffer and provided between said data communication circuit and said second wiring line.

25. A recording medium according to claim 24, wherein said arranging of said data communication block macros is carried out based on the number of second buffers.

26. A recording medium according to claim 25, wherein a summation of the number of said first buffers and the number of said second buffers from said common circuit to said data communication circuit in each of said data communication block macros is the same between said data communication block macros.

27. A recording medium according to claim 26, wherein a summation of the length of the length of said first and second wiring lines from said common circuit to said data communication circuit in each of said data communication block macros is the same between said data communication block macros.

28. A recording medium according to claim 24, wherein said buffering section includes a plurality of said second buffers, and each of said plurality of second buffers is connected with a capacitor corresponding to said first buffer other than one second buffer.

29. A recording medium storing a program for a method of designing a semiconductor integrated circuit device, said program executing wherein said method which comprises:
 providing a common block macro for a common circuit, a data communication circuit macro for a data communication circuit, and transfer section macros for transfer sections, wherein each of said transfer section macros has a layout pattern for an input terminal of a signal and a layout pattern for an output terminal of said signal at corresponding positions said transfer section macros, and said common block macro has a layout pattern for an output terminal of said signal at a position corresponding to said layout pattern for said input terminal of said data communication block macro;
 arranging said common block macro in an area; and
 arranging sets of said data communication circuit and one of said transfer section macros in other areas, respectively, to form the semiconductor integrated circuit device.

* * * * *

UNITED STATES PATENT AND TRADEMARK OFFICE
CERTIFICATE OF CORRECTION

PATENT NO.    : 6,510,549 B1
DATED         : January 21, 2003
INVENTOR(S)   : Okamura It is certified that error appears in the above-identified patent and that said Letters Patent is hereby corrected as shown below:

Column 14,
Line 65, "programs" should be -- program --.

Column 16,
Line 5, "the lenth of" should be deleted.
Line 17, "wherein" should be deleted.

Signed and Sealed this

Twenty-fourth Day of August, 2004

JON W. DUDAS
*Director of the United States Patent and Trademark Office*